United States Patent
Kawano et al.

(10) Patent No.: US 7,145,247 B2
(45) Date of Patent: Dec. 5, 2006

(54) OFFSET-BONDED, MULTI-CHIP SEMICONDUCTOR DEVICE

(75) Inventors: Masaya Kawano, Kanagawa (JP); Satoshi Matsui, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/995,491

(22) Filed: Nov. 24, 2004

(65) Prior Publication Data
US 2005/0121802 A1 Jun. 9, 2005

(30) Foreign Application Priority Data
Nov. 28, 2003 (JP) .............................. 2003-400105
Nov. 1, 2004 (JP) .............................. 2004-317903

(51) Int. Cl.
*H01L 23/48* (2006.01)
*H01L 23/52* (2006.01)
*H01L 29/40* (2006.01)

(52) U.S. Cl. ..................... 257/777; 257/685; 257/686; 257/723; 257/775; 257/E21.027; 257/E23.085; 257/E25.006

(58) Field of Classification Search ................ 257/777, 257/723, 685, 686, 786, E21.027, E23.085, 257/E25.005, E23.006; 438/109, FOR. 365, 438/FOR. 426
See application file for complete search history.

(56) References Cited

U.S. PATENT DOCUMENTS 6,252,305 B1    6/2001  Lin et al.
6,392,292 B1 *  5/2002  Morishita ................. 257/686
6,514,794 B1 *  2/2003  Haba et al. ............... 438/109
6,677,674 B1 *  1/2004  Nagao ...................... 257/724
6,731,009 B1 *  5/2004  Jones et al. ............... 257/777
6,740,980 B1 *  5/2004  Hirose ...................... 257/777
6,843,421 B1 *  1/2005  Chhor et al. .............. 235/492
6,949,835 B1 *  9/2005  Konishi et al. ........... 257/777

FOREIGN PATENT DOCUMENTS

EP    1 401 020 A1    3/2004
JP    10-256472       9/1998
JP    2003-68975      3/2003
WO    WO 02/103793 A1 12/2002

OTHER PUBLICATIONS

German Office Action dated Jan. 26, 2006, with English translation.

* cited by examiner

*Primary Examiner*—Jasmine Clark
(74) *Attorney, Agent, or Firm*—McGinn IP Law Group PLLC

(57) ABSTRACT

The present invention is aimed at bonding a lower chip and an upper chip through bumps in a highly reliable manner, while ensuring a sufficient area for an external connection terminal region, by offsetting the upper chip to the lower chip. The substrate 2 has bumps 1 arranged on one surface thereof, and has a first chip 3 mounted on the other surface thereof. A second chip 4 is bonded to the first chip 3 through bumps 5, 6 while offsetting the second chip 4 to the first chip 3 in parallel. In the bonded state of the first chip 3 and the second chip 4, a part of the first chip 3 and a part of the second chip 4 are overlapped without aligning the centers of the both. The center of gravity of the second chip 4 falls inside a region surrounded by the outermost bumps between the first chip 3 and the second chip 4.

24 Claims, 11 Drawing Sheets

US 7,145,247 B2

OFFSET-BONDED, MULTI-CHIP SEMICONDUCTOR DEVICE

This application is based on Japanese patent applications No. 2003-400105 and No. 2004-317903, the contents of which are incorporated hereinto by reference.

DISCLOSURE OF THE INVENTION

1. Field of the Invention

The present invention relates to a semiconductor device having a mounting unit which comprises semiconductor elements (referred to as "chips", hereinafter) having electrodes formed on the individual surfaces, being bonded so as to be offset to each other and so as to oppose the surfaces thereof, and in particular to a offset-bonded, multi-chip semiconductor device in which two or more semiconductor elements are stacked and bonded.

2. Related Art

For the purpose of reducing both of cost and size of semiconductor integrated circuit device, there is proposed a COC (Chip On Chip)-type semiconductor device in which two LSI chips are bonded with each other based on the face-down bonding style, to thereby form a mounting unit.

A conventional configuration of the COC-type semiconductor device is shown in FIG. 16. The semiconductor device shown in the drawing has a first LSI chip 51 and a second LSI chip 52 mounted thereon. The main surface of the first LSI chip 51 having circuits formed thereon has also internal electrodes 53 and external electrodes 54 formed thereon. The main surface of the second LSI chip 52 having circuits formed thereon has also bumps 55 formed thereon. The first LSI chip 51 and second LSI chip 52 are bonded based on the face-down bonding style, in a form such as connecting the internal electrodes 53 and bumps 55. Between the first LSI chip 51 and second LSI chip 52, an insulating resin 56 is filled. The first LSI chip 51 is solder-fixed on a die pad 60 of a lead frame 57. The external electrodes 54 of the first LSI chip 51 and inner leads 58 of the lead frame 57 are electrically connected through bonding wires 59 composed of thin metal wires. The first LSI chip 51, second LSI chip 52, die pad 60, inner leads 58 and bonding wires 59 are molded by a molding resin 61.

In the above-described configuration of the semiconductor device, it is made impossible to configure the semiconductor device by disposing the external electrodes 54 connected with inner leads 58 of the lead frame 57 on the first LSI chip 51, if the geometrical sizes of the second LSI chip 52 and first LSI chip 51 are almost equivalent, or if the second LSI chip 52 has a larger geometrical size such as exceeding the geometrical size of the first LSI chip 51 arranged thereunder.

The COC-type semiconductor device is often configured by combining chips of different functions, such that the upper and lower chips are a logic and a memory, respectively. For an exemplary case where the upper second LSI chip is a memory chip, the geometrical size of the chip will expand with increase in the memory capacity for the future. On the other hand, for an exemplary case where the lower first LSI chip is a logic chip, fine fabrication of the circuits can reduce the geometrical size. As a consequence, the geometrical size of the memory chip becomes larger than the geometrical size of the logic chip.

In the above-described case, the main chip surface of the lower first LSI chip does not expose outside the upper second LSI chip, and this makes it impossible to arrange the external connection terminals interfaced with the external, on the circumferential portion of the main chip surface. In other words, with the configuration shown in FIG. 16, it is difficult to connect the external electrodes 54 of the first LSI chip 51 and the inner leads 58 of the lead frame 57 through the bonding wires 59.

Various proposals have been made for the purpose of creating the exposed portion (referred to as "external connection terminal region", hereinafter) in which the external connection terminals are disposed. In Japanese Laid-Open Patent Publication No. 10-256472, for example, the upper and lower chips are shifted from each other by rotation, and thereby the main chip surface on the corner portion of the lower chip is allowed to expose from the outer circumference of the upper chip.

Japanese Laid-Open Patent Publication No. 2003-68975 proposes a configuration of the stacked upper and lower chips, aimed at ensuring a larger area for the external connection terminal region, in which one end portion of the lower chip is shifted so as to run over any one of four edges of the upper chip. This document also proposes a semiconductor device in which the upper chip and lower chip are shifted from each other in the diagonal direction.

The method described in Japanese Laid-Open Patent Publication No. 10-256472, in which one chip is rotated and thereby shifted from the other chip so as to allow the corner portion of the lower chip to expose, while keeping coincidence of the centers of the upper and lower chips, and the exposed portion is used as the external connection terminal region, however, allows only a limited number of electrodes arranged therein.

The situation places an advantage on the method described in Japanese Laid-Open Patent Publication No. 2003-68975, in which the upper chip and lower chip are shifted in parallel so as to avoid coincidence of the centers of the both, to thereby secure a larger area for the external connection terminal region.

Shifting of the upper and lower chips in this way may, however, result in a case, as shown in FIG. 17, where the center of gravity G of an upper chip 61 falls outside a region surrounded by the outermost bumps between the upper chip 61 and a lower chip 62. This produces tensile stress (indicated by a filled arrow in FIG. 17) to the bump 63 under load (indicated by blank arrows in FIG. 17) from the top exerted by the upper chip 61. The stress may result in breakage of the bumps 63 between the upper and lower chips, to thereby degrade the bonding reliability.

The situation therefore raises a demand on a COC-type semiconductor device in which the upper and lower chips are bonded through the bumps by offsetting the upper chip to the lower chip so as to avoid coincidence of the centers of the both, to thereby ensure highly reliable bonding of the chips while securing a sufficient area for the external connection terminal region.

SUMMARY OF THE INVENTION

According to the present invention, there is provided a semiconductor device having a first semiconductor element and a second semiconductor element stacked thereon without aligning the centers of the both, and electrodes formed on the first semiconductor element being connected through bumps to electrodes formed on the second semiconductor element in the overlapped region, wherein the center of gravity of the second semiconductor element falls inside a first bump area surrounded by the outermost bumps out of the bumps bonding the first semiconductor element and the second semiconductor element.

According to this configuration, the load of the upper second semiconductor element can act only as a pressing force which pressurizes the bumps between the first semiconductor element and second semiconductor element, and never exerts tensile force to the bumps. For the case where the upper second semiconductor element is shifted with respect to the lower first semiconductor element to thereby produce the external connection terminal region on the first semiconductor element, this configuration makes it possible to keep a high reliability of bonding through the bumps between the first semiconductor element and second semiconductor element.

In thus-configured semiconductor device, the center of the first bump area and the center of gravity of the second semiconductor element preferably coincide with each other. According to this configuration, the pressing force to the bumps is exerted without being biased with respect to the circumferential direction around the center of gravity of the second semiconductor element, and this makes it possible to further raise the bonding reliability.

The present invention is applicable to the semiconductor device in which the first bump area comprises three bump groups comprising those for input/output, those for power supply and those for GND. In this case, the second semiconductor element can be a memory chip.

The present invention is also applicable to the semiconductor device in which the first bump area comprises bump groups formed symmetrically at least about a single axis on the basis of the center line of the second semiconductor element.

In thus-configured semiconductor device, it is preferable that the first semiconductor element has a plurality of external connection terminals arranged in a region thereof outside the overlapped region with the second semiconductor element, and that the plurality or external connection terminals are arranged in a staggered manner. The staggered arrangement of the external connection terminals narrows a pitch of arrangement of the external connection terminals as compared with that in a non-staggered arrangement. A given area for the external connection terminal region will therefore have a larger number of external connection terminals arranged therein when the staggered arrangement is adopted. This is advantageous in that only a small amount of shift of the second semiconductor element with respect to the first semiconductor element will suffice even if the number of the external connection terminals increases. In other words, the center of gravity of the second semiconductor element is readily allowed to fall inside the first bump area even when the number of the external connection terminal increases.

It is also preferable that a third semiconductor element is stacked on the second semiconductor element, so that the center of gravity of the third semiconductor element coincides with the center of gravity of the second semiconductor element. It is still also preferable that a plurality of semiconductor elements are stacked on the second semiconductor element, so that each of the centers of gravity of the plurality of semiconductor elements respectively coincides with the center of the second semiconductor element.

For the case where one, or a plurality of the semiconductor elements are stacked on the second semiconductor element, coincidence of the centers of gravity of the stacked semiconductor elements with the center of gravity of the second semiconductor element makes it possible to exert only pressing force over the entire bonding portions (bumps, for example) between every adjacent stacked semiconductor elements, and this successfully avoids degradation in the bonding reliability.

In thus-configured semiconductor device of the present invention, the first semiconductor element and the second semiconductor element are bonded while allowing one end face of the second semiconductor element to run over at least one end face of the first semiconductor element.

In this case, it is preferable to arrange a dummy chip under the run-over region of the second semiconductor element, and to bond the second semiconductor element and dummy chip through the bumps. That is, according to the present invention, there is also provided a semiconductor element having a first semiconductor element and a second semiconductor element stacked thereon without aligning the centers of the both, while allowing one end face of the second semiconductor element to run over at least one end face of the first semiconductor element; electrodes formed on the first semiconductor element being connected through bumps to electrodes formed on the second semiconductor element in the overlapped region; and a dummy chip being arranged under the run-over region of the second semiconductor element, and the electrodes formed on the second semiconductor element being bonded through bumps to electrodes formed on the dummy chip; wherein the center of gravity of the second semiconductor element falls inside a region having a maximized area which is determined by connecting the outermost bumps in a first bump area and the outermost bumps in a second bump area so as to include the entire portions of the individual bump areas, the first bump area being surrounded by the outermost bumps bonding the first semiconductor element and the second semiconductor element, and the second bump area being surrounded by the outermost bumps bonding the second semiconductor element and the dummy chip.

According to this configuration, the center of gravity of the second semiconductor element is supported by the dummy chip so as to fall inside the second bump area, or inside a region which is determined by connecting the outermost bumps in the first bump area and the outermost bumps in the second bump area, so that it is made possible to keep the mechanical strength even if the upper second semiconductor element largely runs over of the lower first semiconductor element, and the center of gravity of the upper second semiconductor element consequently falls outside the first bump area connecting the lower first semiconductor element and upper second semiconductor element.

This is also advantageous in preventing the resin from running into a space under the second semiconductor element when the first semiconductor element and second semiconductor element are molded by the resin, because the space under the run-over second semiconductor element is occupied by the dummy chip. Because the dummy chip less causative of thermal expansion than the resin is disposed under the second semiconductor element, the second semiconductor element is less likely to be applied with the load in heat cycle test, and disconnection at the bump connection portion will be avoidable. The occupancy of the space under the run-over second semiconductor element by the dummy chip is also successful in preventing the air from remaining under the second semiconductor element, after the bonded first semiconductor element and second semiconductor element are molded with the resin. The second semiconductor element is, therefore, no more likely to be applied with the load by the resin swelled due to air expansion during the heat cycle test, so that there will be no fear of causing disconnection at the bump connection portion.

The dummy chip in this case is preferably composed of a material having a thermal expansion coefficient close to that of Si. It is still more preferable that the dummy chip is composed of Si.

It is also preferable that thickness of the dummy chip falls between a maximum value and a minimum value, where the maximum value is defined by a sum of thickness of the first semiconductor element and height-before-bonding of the bumps formed on the first semiconductor element, and the minimum value is defined by a balance obtained by subtracting the height-before-bonding of the bumps formed on the second semiconductor element from distance-after-bonding between the back surface of the first semiconductor element and the top surface(bump forming surface) of the second semiconductor element. According to this configuration, bump bonding of the second semiconductor element and first semiconductor element can be established, even if the dummy chip resides under the run-over region of the second semiconductor element, so that the bumps of the second semiconductor element can connect with the dummy chip in a reliable manner.

It is preferable that the dummy chip has a metal film formed on the surface thereof, and the metal film preferably comprises a Cr film and an Au film formed thereon. Formation of the Au film on the dummy chip composed of Si, while placing the Cr film in between, successfully improves adhesiveness of the Au film. This sort of film configuration is also desirable in view of improving the adhesiveness of the bumps of the second semiconductor element and the dummy chip, when the bumps of the second semiconductor element are composed of Au.

It is still also preferable that the thickness of the dummy chip is equivalent to the thickness of the first semiconductor element. According to the configuration, the first semiconductor element and the dummy chip are given with a configuration which is equivalent from the viewpoint of the bump bonding, so that it is made possible to carry out a stable bump bonding.

According to the present invention in which the upper second semiconductor element is arranged as being shifted from the lower first semiconductor element, and in which the external connection terminals are disposed on the exposed portion of the surface of the first semiconductor element, the first semiconductor element and second semiconductor element are bonded so that the center of gravity of the second semiconductor element falls inside the area surrounded by the bumps between the first semiconductor element and the second semiconductor element. According to this configuration, the load of the upper second semiconductor element can act only as a pressing force which pressurizes the bumps between the first semiconductor element and second semiconductor element, and never exerts tensile stress to the bumps. This makes it possible to keep a high reliability of bonding through the bumps between the first semiconductor element and second semiconductor element.

The semiconductor device is also configured as having a first semiconductor element and a second semiconductor element stacked thereon, while allowing one end face of the second semiconductor element to run over at least one end face of the first semiconductor element; disposing a dummy chip under the run-over region of the second semiconductor element, bonding the second semiconductor element to the dummy chip through the bumps; and allowing the center of gravity of the second semiconductor element to fall inside a region having a maximized area which is determined by connecting the outermost bumps in a first bump area and the outermost bumps in a second bump area so as to include the entire portions of the individual bump areas, where the first bump area is surrounded by the outermost bumps bonding the first semiconductor element and the second semiconductor element, and the second bump area is surrounded by the outermost bumps bonding the second semiconductor element and the dummy chip. This configuration makes it possible to ensure the mechanical strength and to improve reliability in the electrical bonding, even when the center of gravity of the second semiconductor element falls outside the region surrounded by the bumps between the first semiconductor element and second semiconductor element.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

(First Embodiment)

Figure 1:
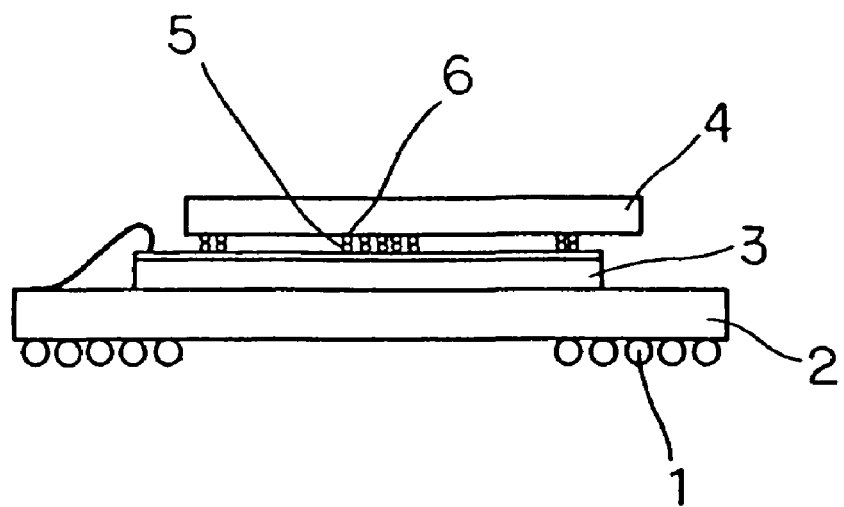
FIG. 1 is a side elevation showing a configuration of a COC-type semiconductor device stacking a first chip and a second chip according to a first embodiment of the present invention.
Figure 2:
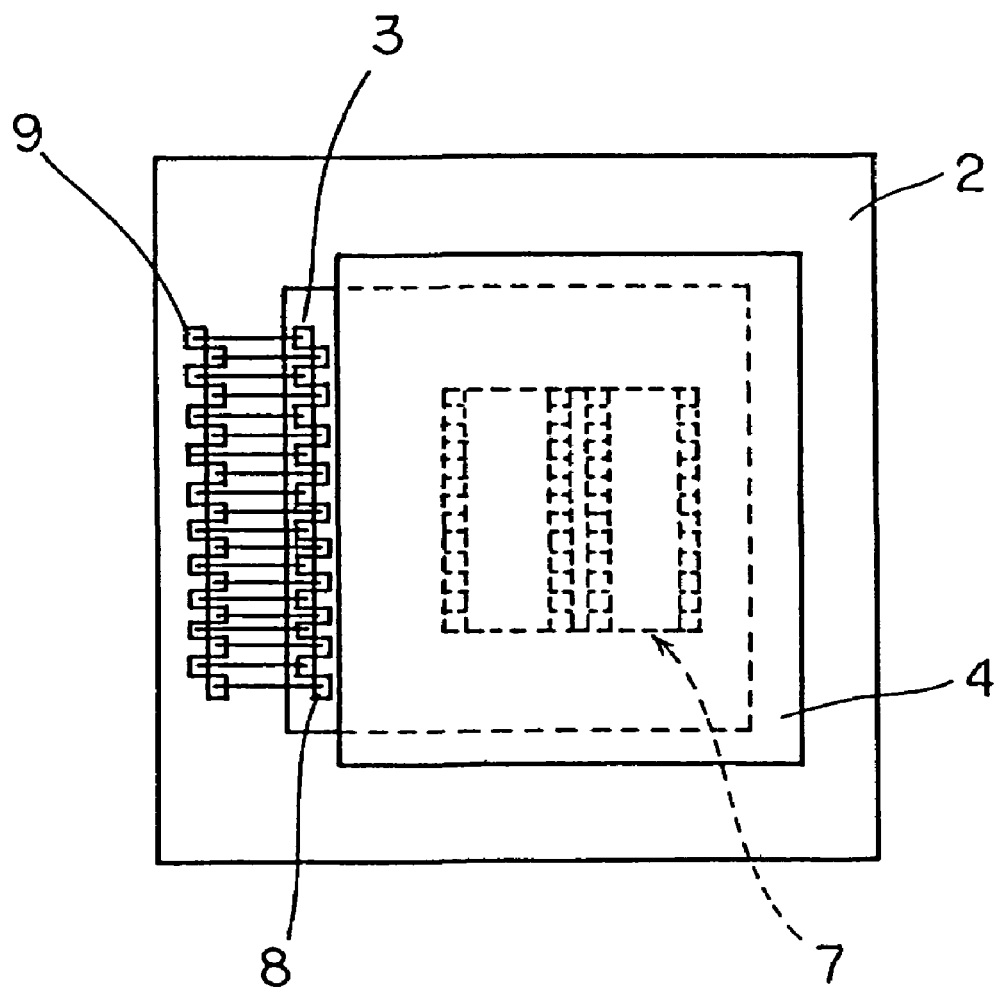
FIG. 2 is a plan view showing the semiconductor device shown in FIG. 1.

FIG. 1 is a side elevation showing a configuration of a COC-type semiconductor device according to the first embodiment of the present invention, and FIG. 2 is a plan view of the semiconductor device shown in FIG. 1.

Referring now to FIG. 1, ball bumps 1 as electrode terminals are arranged on one surface of a substrate (printed wiring board, for example) 2 having electric wirings already formed thereon. On the other surface of the substrate 2, a first chip 3 is mounted. The first chip 3 and a second chip 4 are bonded with each other so that the second chip 4 is shifted in parallel from the first chip 3, while allowing a portion of the second chip 4 to run over the first chip 3.

The first chip 3 disposed on the lower side is a logic chip, and the second chip 4 is a memory chip having a larger geometrical area than that of the logic chip. The first chip 3 can be a silicon chip.

The first chip 3 and second chip 4 are bonded based on the face-down bonding style. That is, the surface of the first chip 3 and the surface of the second chip 4 are opposed, and bumps 6 arranged on the surface electrodes of the second chip 4 are bonded to bumps 5 arranged on the surface electrodes of the first chip 3. The embodiment herein shows a technique by which the bumps are arranged on both of the surface electrodes of the upper chip and lower chip, and bonded with each other, whereas it is also allowable to use the bumps 6 on the upper second chip 4 for bonding with the lower first chip 3 having no bumps 5 arranged thereon.

The region of the first chip 3 not being overlapped with the second chip 4 is an external connection terminal region where a plurality of bonding pads 8 are arranged.

The bonding pads 8 on the first chip 3 are electrically connected with the bonding pads 9 arranged on the circumferential portion of the substrate 2. The bonding pads 9 are electrically connected further to the ball bumps 1 on the back surface of the substrate 2. The external connection is not always necessarily be established by the ball bumps 1 as shown in FIG. 1. It is also allowable to use a lead frame in place of the ball bumps 1.

In the connection state of the first chip 3 and second chip 4, a portion of the first chip 3 and a portion of the second chip 4 overlap without aligning the centers of the both. Moreover in the present invention, the center of gravity of the second chip 4 falls inside the area surrounded by the outermost bumps between the first chip 3 and second chip 4 (referred to as "bump area 7", hereinafter). It is to be understood that "inside" also includes the position just on the outermost bumps. Because the bumps are not points but have a sectional area, the "inside" more strictly means the position on the outer contour of the outermost bumps and the area inside thereof. In the present embodiment, the center of gravity of the second chip 4 coincides with the center of the bump area 7.

Figure 3:
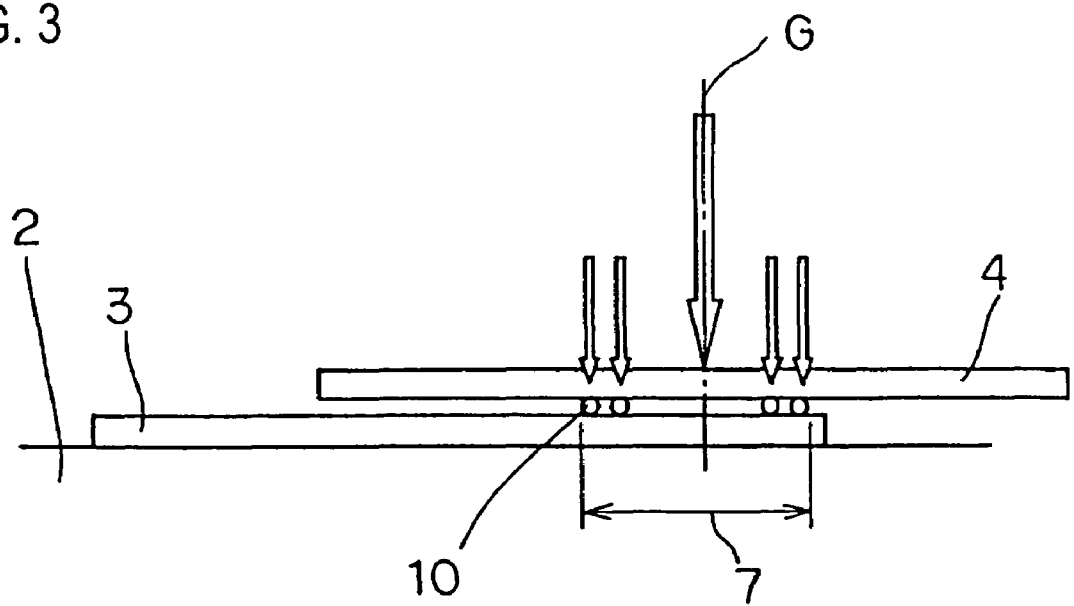
FIG. 3 is a drawing explaining effects of the COC-type semiconductor device according to the first embodiment of the present invention.

Effect of this configuration will be explained referring to FIG. 3. FIG. 3 shows the bumps 5, 6 shown in FIG. 1 as a single bump 10 for simplicity of the explanation.

As shown in FIG. 3, when the first chip 3 and second chip 4 are bonded so as to align the center of gravity G of the second chip 4 with the center of the bump area 7, all bumps 10 will be applied only with pressing force. In other words, no tensile stress is applied to the bumps 10, and this successfully avoids degradation in the bonding reliability.

In this embodiment, the bonding pads 8 on the surface of the first chip 3 exposed out from the second chip 4 are arranged in a staggered pattern. The staggered arrangement of the bonding pad 8 narrows a pitch of arrangement of the bonding pads 8 as compared with that in a non-staggered arrangement. The staggered arrangement can therefore set a larger number of the pads for a given area of the external connection terminal region. This is advantageous in that only a small amount of shift (offset) of the second chip 4 with respect to the first chip 3 will suffice if the number of the pads in the external connection terminals region increases. In other words, the center of gravity of the second chip 4 is readily allowed to fall inside the bump area 7 even when the number of the pads in the external connection terminal region increases.

Although the above-described embodiment showed a configuration (see FIG. 2) in which the second chip 4 was shifted with respect to the first chip 3 so as to make the straight-formed external connection terminal region, the present invention is not limited to this configuration. It is also allowable to apply any combinations of chips of different functions to the present invention, although the above-described first chip 3 and second chip 4 were respectively configured as a logic chip and a memory chip having a larger geometrical area than that of the logic chip.

Figure 6:
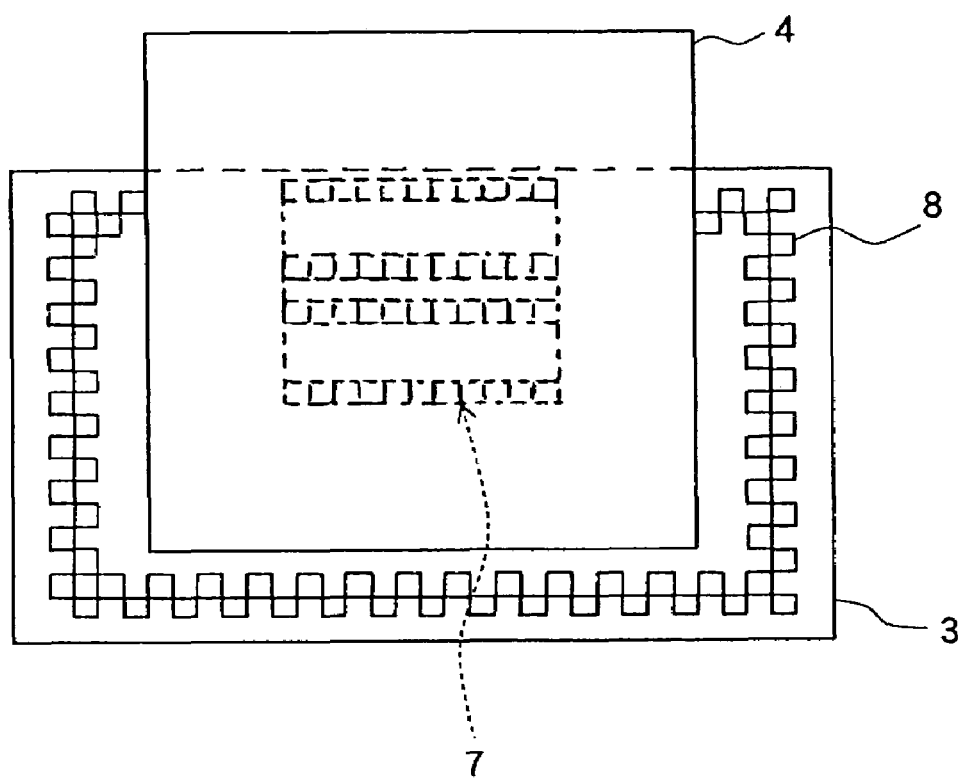
FIG. 6 is a plan view showing still another mode of the mounting unit configured by stacking the first chip and second chip.

Possible examples thereof are exemplified by the mounting units shown in drawings (b) and (c) in FIG. 6 of Japanese Laid-Open Patent Publication No. 2003-68975. For any cases where the semiconductor device is configured using mounting units of any other embodiment, the first chip 3 and second chip 4 are bonded of course so as to make coincidence between the center of gravity G of the second chip 4 and the center of the bump area 7.

FIG. 4, FIG. 5, FIG. 6, FIGS. 7A, 7B and FIG. 8 show other embodiments of the mounting unit configured by stacking the first chip 3 and second chip 4.

Figure 4:
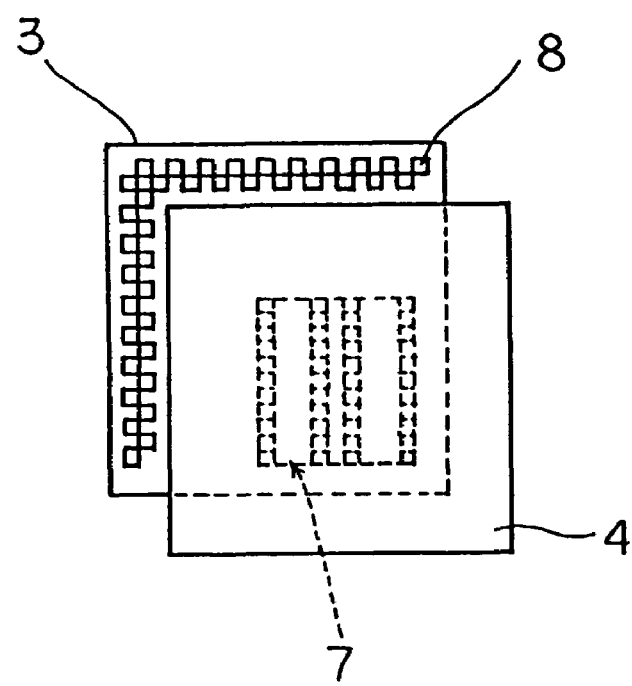
FIG. 4 is a plan view showing another mode of a mounting unit configured by stacking the first chip and second chip.

One possible configuration has, as shown in FIG. 4, an L-formed external connection terminal region on the first chip 3, which is obtained by shifting the second chip 4 with respect to the first chip 3 in the diagonal direction. This configuration facilitates stacking of the elements (GaAs, SiGeC, CMOS) often made into a square form by the various processes.

Figure 5:
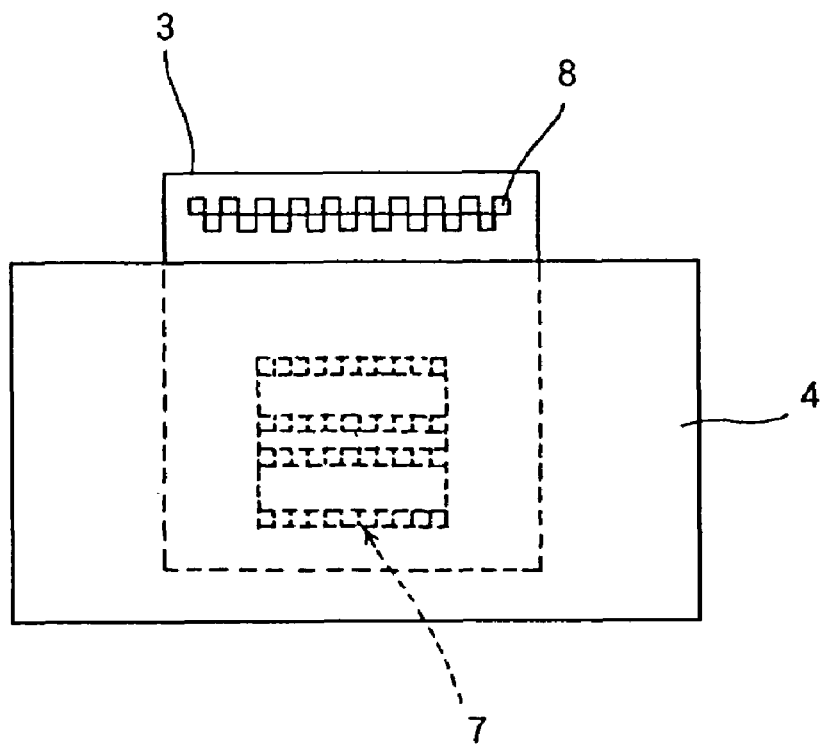
FIG. 5 is a plan view showing still another mode of the mounting unit configured by stacking the first chip and second chip shown in FIG. 2.

For the case where the upper second chip 4 has a rectangular form, one possible configuration is such as allowing one end portion of the lower first chip 3 to run over one of four edges of the upper second chip 4, as shown in FIG. 5.

For the case where the lower first chip 3 has a rectangular form, another possible configuration is such as allowing one end portion of the upper second chip 4 to run over one of four edges of the lower first chip 3, as shown in FIG. 6. Still another possible configuration is, as shown in 7, such as having a rectangular upper second chip 4 shifted so as to allow a portion thereof to run over one of four edges of the lower first chip 3.

The running over of the second chip 4 with respect to the first chip 3 in this way makes it possible to provide a large area for the external connection terminals and to secure therein a large number of terminals.

Figure 8:
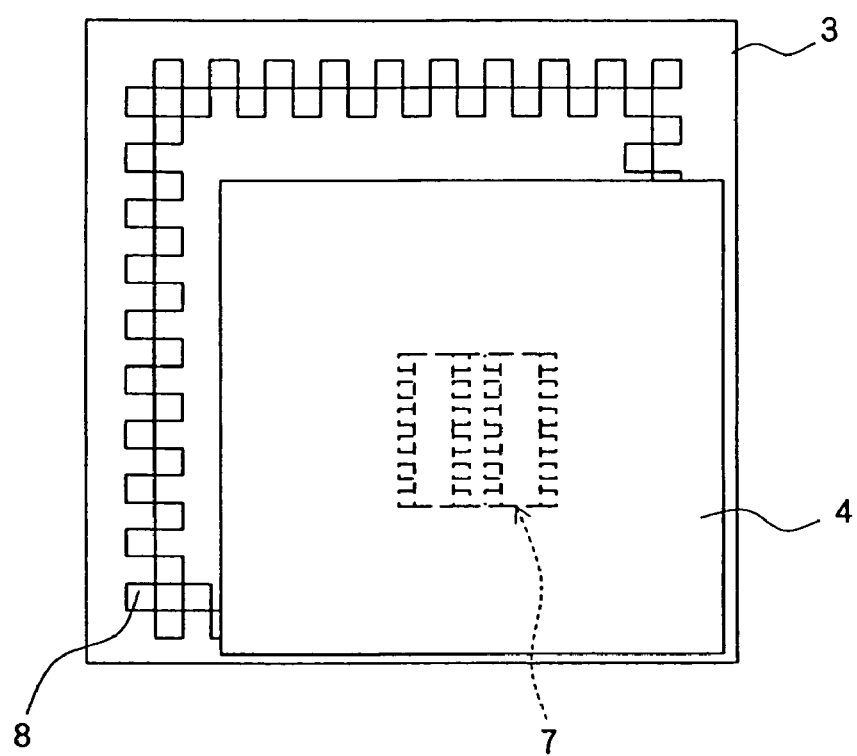
FIG. 8 is a plan view showing still another mode of the mounting unit configured by stacking the first chip and second chip.

On the other hand, for the case where the second chip 4 has an almost similar geometry with that of the first chip 3, a possible configuration is such as shifting the second chip 4 as shown in FIG. 8, so that one end portion thereof is brought close to at least one of four edges of the first chip 3. FIG. 8 shows a special case where the first chip 3 and second chip 4 has a square form in common, the upper second chip 4 is smaller than the lower first chip 3 and therefore do not run over the first chip 3, and the center of gravity of the second chip 4 falls inside the bump area 7.

Figure 7A:
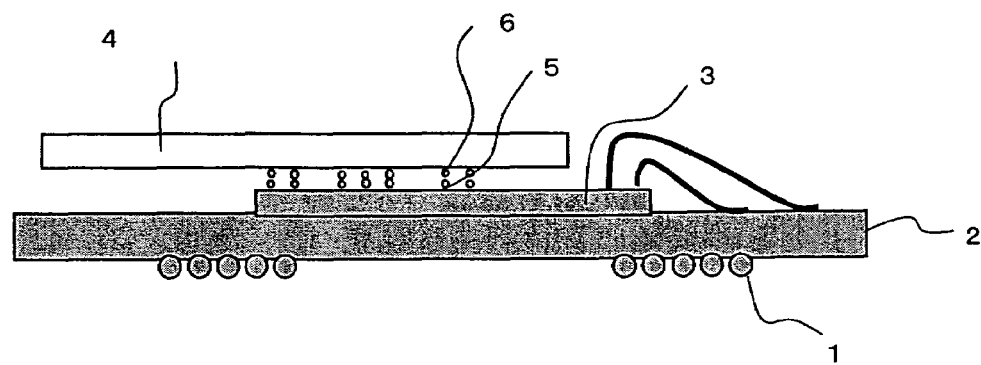
FIGS. 7A and 7B are a side elevation and a plan view, respectively, showing still another mode of the mounting unit configured by stacking the first chip and second chip.
Figure 7B:
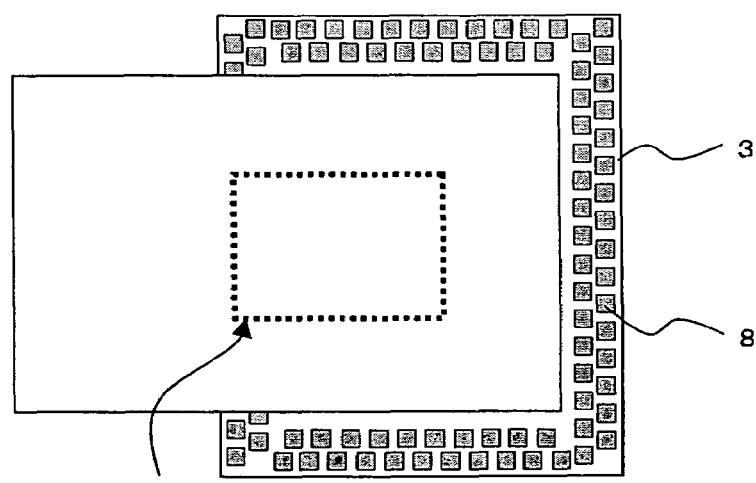

The exemplary cases shown in FIG. 6 and FIGS. 7A and 7B have a large space under the run-over region of the upper second chip 4 with respect to the lower first chip 3.

Figure 9A:
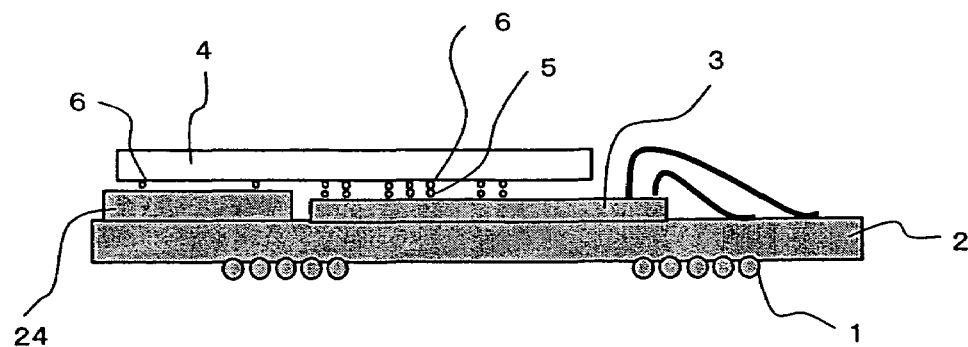
FIGS. 9A and 9B are a side elevation and a plan view, respectively, showing an exemplary semiconductor device of the present invention aimed at further improving the mechanical strength and reliability in the electrical connection.
Figure 9B:
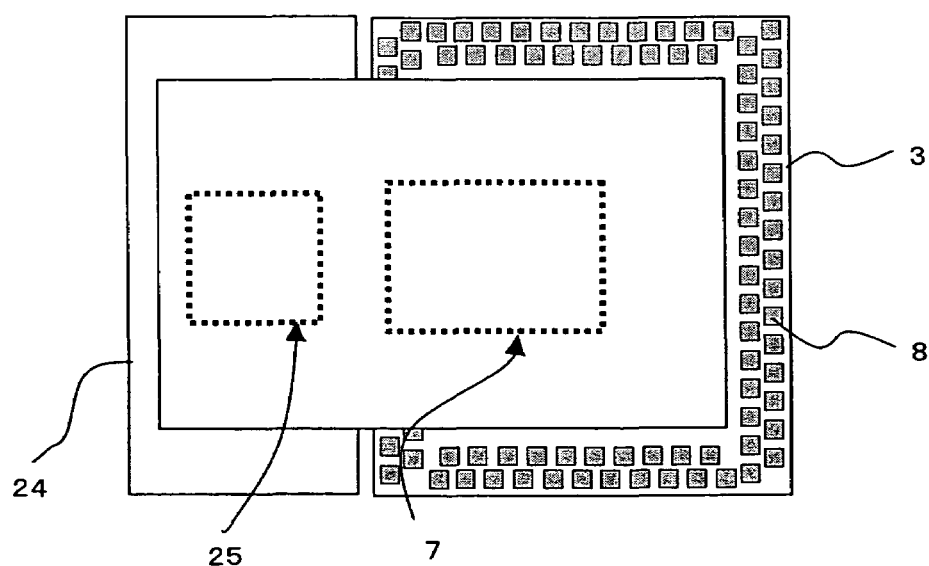

A configuration shown in FIGS. 9A and 9B is possible in view of securing the reliability and mechanical strength for the case where the second chip 4 runs over the first chip 3 to a considerable degree. The configuration shown in FIGS. 9A and 9B is such as having, in addition to the configuration shown in FIG. 7, a dummy chip 24 disposed under the run-over region of the second chip 4, and bonding the second chip 4 and the dummy chip 24. The configuration makes it possible to stabilize the structure in which the second chip 4 largely runs over the first chip 3 is supported by the dummy chip 24, and to ensure mechanical strength desirable for the a multi-chip module. Because the dummy chip 24 is disposed in the space under the run-over second chip 4, the resin is almost completely prevented from entering the space under the second chip 4 during the packaging process based on resin molding of the first chip 3 and second chip 4. The disposition of the dummy chip 24 less causative of thermal expansion than the resin under the second chip 4 makes the second chip 4 less likely to be applied with the load in heat cycle test, and thereby disconnection at the bump connection portion will be avoidable. The occupancy of the space under the run-over second chip 4 by the dummy chip 24 is also successful in preventing the air from remaining under the second chip 4, after packaging of the first chip 3 and second chip 4 based on resin molding. The second chip 4 is, therefore, no more likely to be applied with the load by the resin swelled due to air expansion during the heat cycle test, so that there will be no fear of causing disconnection at the bump connection portion.

The dummy chip 24 herein can ensure a larger reliability if it is composed of a material having a thermal expansion coefficient close to that of a material of the first chip 3. More specifically, Pyrex (a registered trademark) glass and Si are preferable.

Thickness of the dummy chip 24 is set so that it falls between a maximum value and a minimum value, where the maximum value is defined by a sum of thickness of the first chip 3 and height-before-bonding of the bumps 5 formed on the first chip 3, and the minimum value is defined by a balance obtained by subtracting the height-before-bonding of the bumps 6 formed on the second chip 4 from distance-after-bonding between the back surface of the first chip 3 and the top surface(bump forming surface) of the second chip 4. According to this configuration, bump bonding of the second chip 4 and first chip 3 can be established, even if the dummy chip 24 resides under the run-over region of the second chip 4, so that the bumps 6 of the second chip 4 can connect with the dummy chip 24 in a reliable manner.

Si is used herein as the dummy chip 24, a Cr film and an Au film is formed in this order on the surface of Si, and gold bumps are used as the bumps 6 of the second chip 4. This makes it possible to tightly contact the bumps 6 of the second chip 4 with the dummy chip 24. The Cr film on the surface of Si composing the dummy chip 24 is used for improving the adhesiveness between the Si surface and the topmost Au film.

Of course, the adhesiveness improving layer is not limited to Cr, but can arbitrarily be selected from any materials so far as they can improve the adhesiveness with the Si surface, examples of which include Ni, Ti, Ta, W, TiN and TaN. The present embodiment showed an exemplary case where the Au film was formed on the dummy chip 24 because the gold bumps were adopted. Besides this, the bump may be solder bump, copper bump, nickel bump, and bumps obtained by stacking these materials such as Au/Ni bump and Sn/Cu bump. Also the metal film to be stacked on the dummy chip 24 is not limited to the Au film, but can arbitrarily be selected from the materials listed in the above.

In the configuration shown in FIGS. 9A and 9B, the thickness of the dummy chip 24 was set almost equivalent to that of the first chip 3, bumps having almost same geometry with those on the first chip 3 were formed also on the dummy chip 24, and the second chip 4 was bonded to the first chip 3 and dummy chip 24 respectively in a bump-to-bump manner. The bumps on the dummy chip 24 herein are dummy bumps not contributable to any electrical connection unlike the bumps on the first chip 3. This makes the first chip 3 and dummy chip 24 have a structure which is equivalent in view of the bump bonding, and to realize a stable bump bonding.

Figure 10:
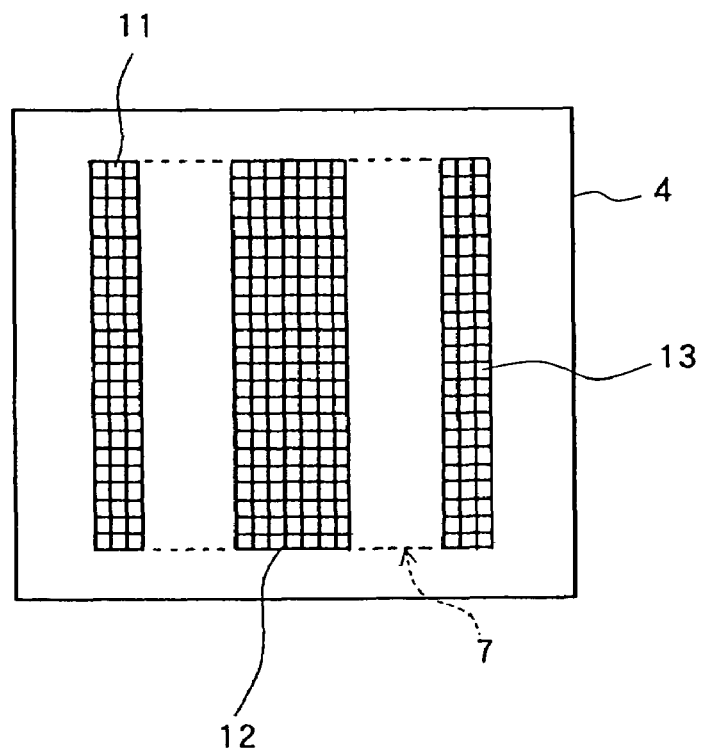
FIG. 10 is a plan view showing another exemplary bump configuration of the second chip suitable for the semiconductor device of the present invention.

The bump area 7 of the second chip 4 as a memory chip has, as shown in FIG. 10, three bump groups comprising those for input/output, those for power supply and those for GND. More specifically, a center I/O bump group 12 is configured as having a plurality of bump rows, each of which comprising a plurality of I/O bumps (bumps for input/output signals), laterally arranged. A GND bump group 13 disposed on the right hand side of the center I/O bump group 12 in the drawing is configured as having a plurality of bump rows, each of which comprising a plurality of GND bumps, laterally arranged. A power supply bump group 11 disposed on the left hand side in the drawing is configured as having a plurality of bump rows, each of which comprising a plurality of power supply bumps, laterally arranged.

Figure 11:
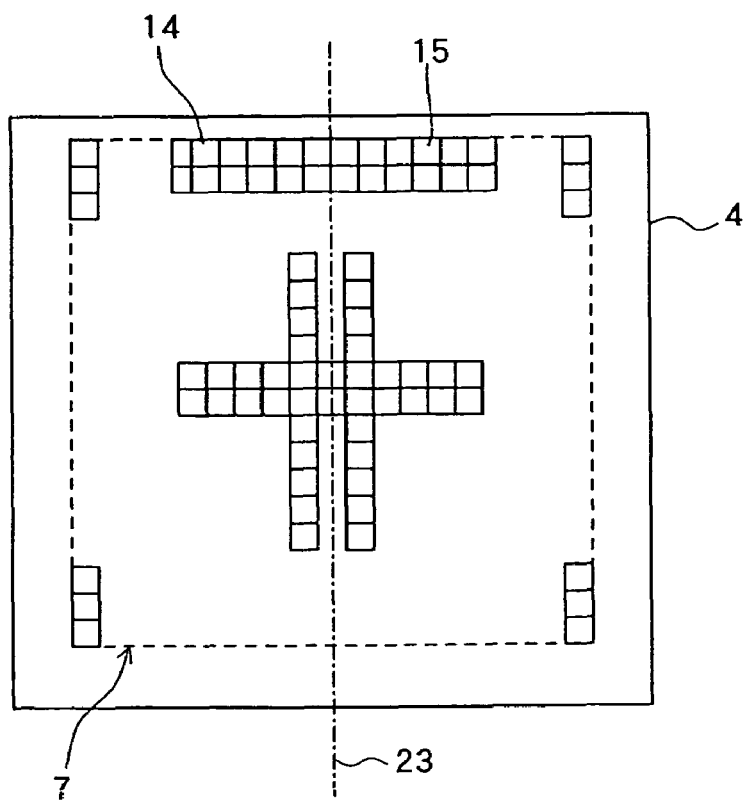
FIG. 11 is a plan view showing another exemplary bump configuration of the second chip suitable for the semiconductor device of the present invention.

Besides the bump arrangement in the bump area 7 shown in FIG. 10, another possible configuration is shown in FIG. 11, in which bump groups 14, 15 comprising an approximately same number of bumps are arranged symmetrically about a single axis on the basis of the center line 23 (so-called reflection symmetry) of the second chip 4. It is to be understood herein that the present invention is not limited to the bump area comprising two bump groups, and allows any other number of bump groups. An exemplary case of memory will have a cross-formed single bump group.

The bump area is not limited to those having the bump groups arranged symmetrically about a single axis, but may be symmetric about two axes in the lateral and longitudinal directions. It is to be understood herein that the expression "symmetry" involves also an incomplete symmetry, because the bump areas cannot always show a perfect symmetry depending on the arrangement of alignment marks provided thereon and arrangement of a power source.

Figure 12A:
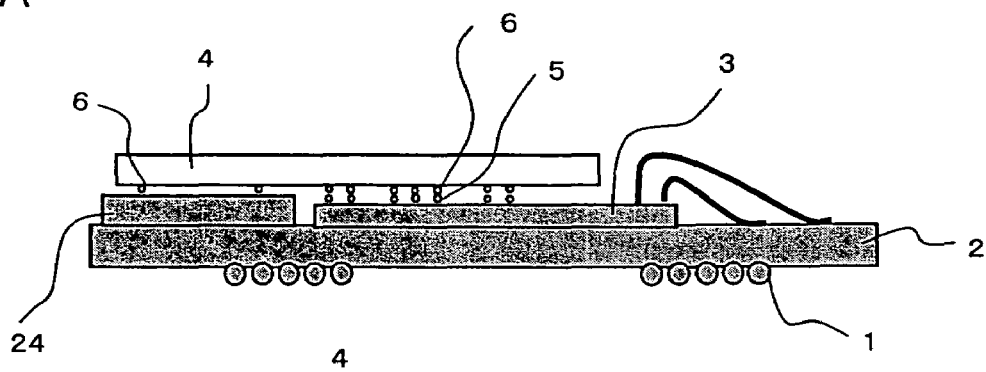
FIGS. 12A to 12C are drawings showing an exemplary semiconductor device of the present invention aimed at further improving the mechanical strength and reliability in the electrical connection.
Figure 12B:
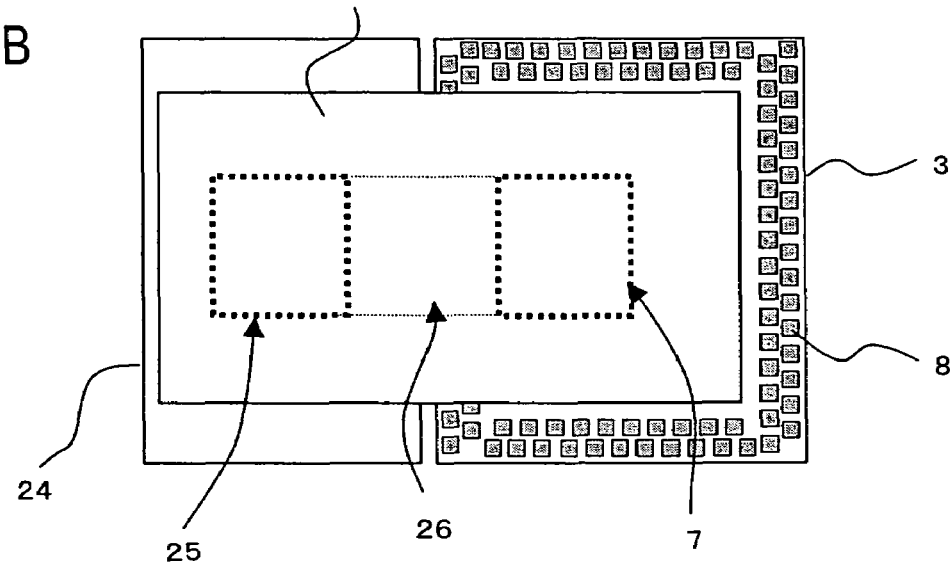
Figure 12C:
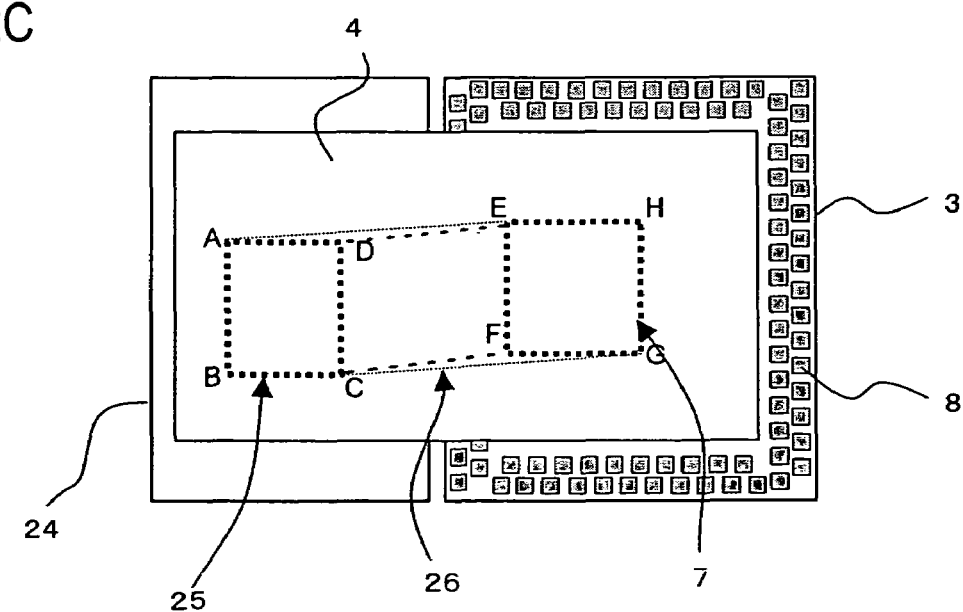

FIGS. 9A and 9B show an exemplary case where the center of gravity of the second chip 4 falls inside the bump area 7 bonding the first chip 3 and second chip 4, but use of the dummy chip 24 also makes it possible, as shown in FIGS. 12A to 12C, to locate the center of gravity of the second chip 4 outside the bump area 7. FIG. 12B shows an exemplary case where the bump area 7 (first bump area) bonding the first chip 3 and second chip 4, and the dummy bump area 25 (second bump area) bonding the dummy chip 24 and second chip 4 are configured as having the same geometry. The center of gravity of the second chip 4 herein falls in an intermediate region 26 between the bump area 7 and dummy bump area 25. This configuration makes it possible to ensure a stable bump bonding. FIG. 12C shows an exemplary case where the bump area 7 (first bump area) bonding the first chip 3 and second chip 4, and the dummy bump area 25 (second bump area) bonding the dummy chip 24 and second chip 4 are configured as having different geometries and being shifted in the direction of Y axis of the drawing. In this case, a stable bump bonding can be achieved by allowing the center of gravity of the second chip 4 to fall inside a region having a maximized area which is determined by connecting the outermost bumps in a first bump area and the outermost bumps in a second bump area so as to include the entire portions of the individual bump areas, where the first bump area is bounded by square EFGH and the second bump area is bounded by square ABCD. More specifically, the maximized area including the entire portions of the first bump area and second bump area is defined by connecting outermost bump E in the first bump area and outermost bump A in the second bump area with a straight line, and by connecting the outermost bump G in the first bump area and outermost bump C in the second bump area again with a straight line, so as to allow the center of gravity of the second chip to fall therein. In this case, the maximum region will have a larger area than the area defined by connecting the bumps E, D and bumps F, C on the opposing edges EF, DC of the first bump area and second bump area, which is larger by triangles AED and FCG. A stable bump bonding is also obtainable if the center of gravity of the second chip falls inside the triangles.

Figure 13A:
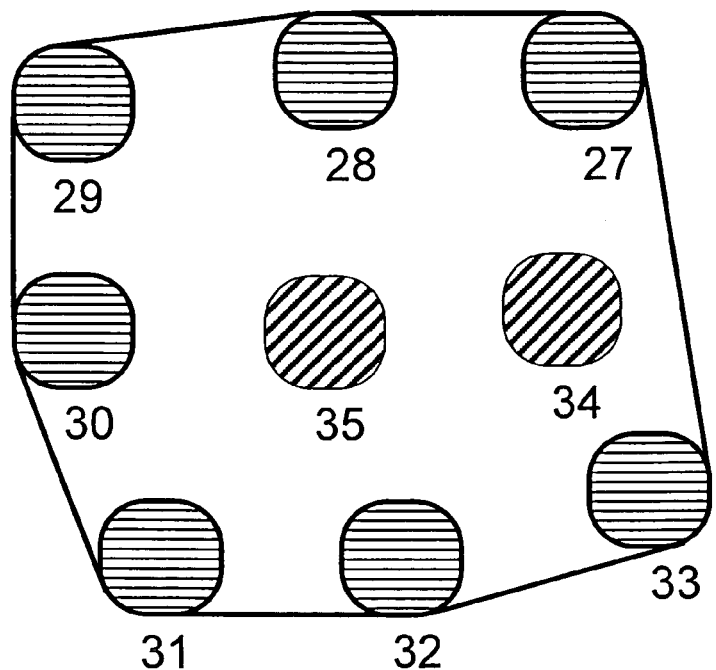
FIGS. 13A and 13B are drawings showing definition of the bump area and the maximized area in which the center of the gravity of the second chip can be fallen in the present invention.
Figure 13B:
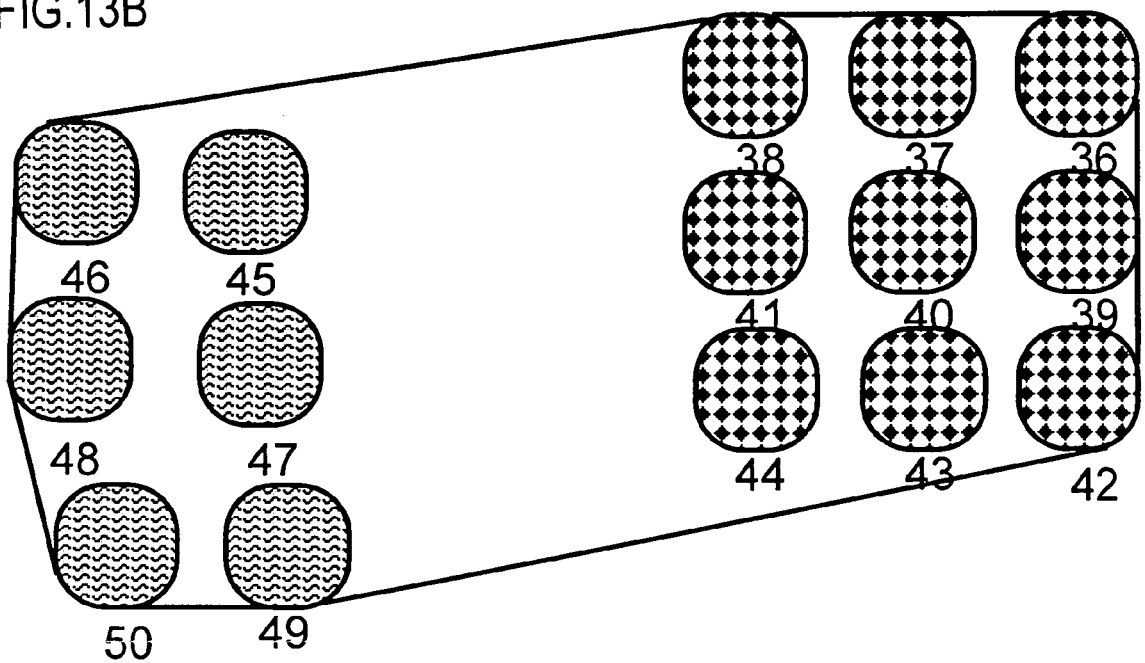

In some cases, the bump area may be configured by a plurality of irregularly-scattered bump groups. In this case, the bump area is defined by a maximized area surrounded by straight lines and the outer circumferences of the bump groups, obtained when the circumference of the outermost bumps in the bump groups located on the outer circumferential region of the chip are connected with straight lines so as to include all bump groups. FIG. 13A shows an exemplary case where nine bump groups are formed as viewed from the second chip. Any configurations other then the bump groups are not illustrated. Of these, seven bump groups 27 to 33 have the outermost bumps, and two bump groups 34, 35 have no outermost bumps. The bump area herein is, therefore, defined by an area surrounded by straight lines connecting the outermost bumps in the adjacent bump groups in the seven bump groups, other than bump groups 34, 35, located on the outer circumferential portion of the chip, and the outer circumferences of seven bump groups. The center of gravity of the second chip is designed to fall within the area. FIG. 13B shows an exemplary case where the first bump area comprises nine bump groups 36 to 44, and the second bump area comprises six bum groups 45 to 50 (any configurations other than the bump groups are illustrated), wherein the maximized area inclusive of all bump regions is defined. Although the above-described cases relates to nearly-rectangular first bump area and second bump area, the present invention is by no means limited to rectangular ones, and allows L-shape, circle or other polygons other than rectangle. The maximized area can similarly be defined also for the first bump area and second bump area having these geometries.

(Second Embodiment)

The first embodiment exemplified the semiconductor device having two chips stacked on the substrate, but the present embodiment will exemplify a semiconductor device having three or more chips stacked on a substrate.

Figure 14:
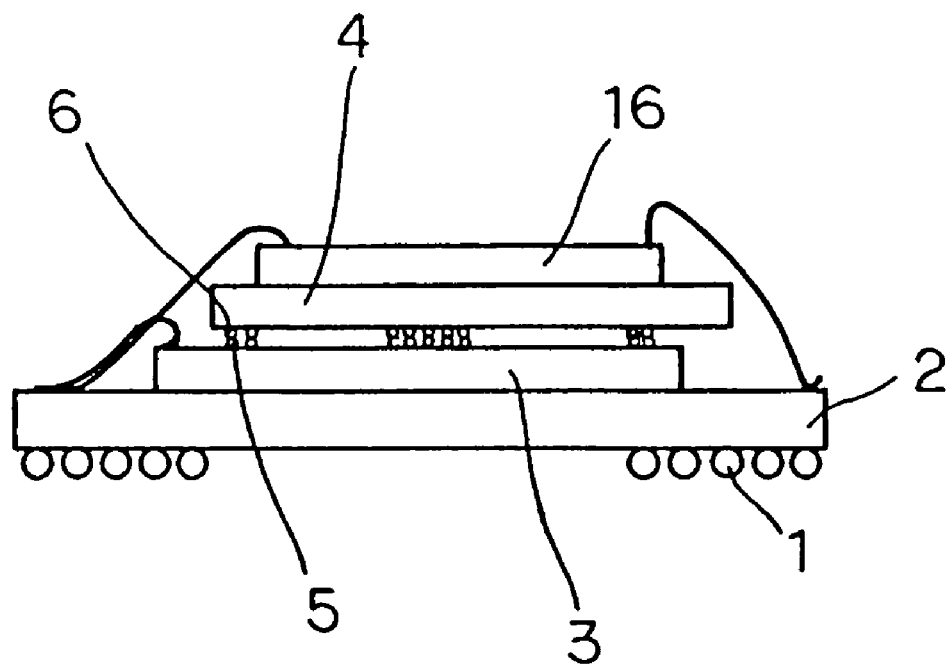
FIG. 14 is a side elevation showing an exemplary COC-type semiconductor device having three chips stacked therein according to a second embodiment of the present invention.
Figure 15:
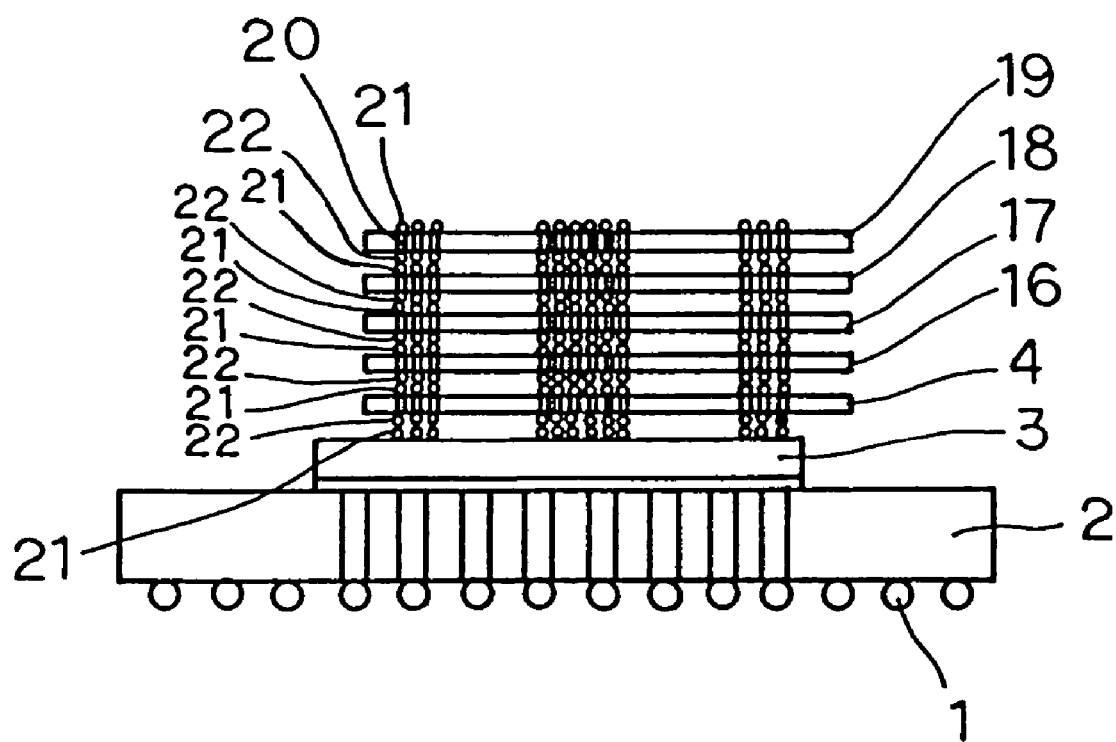
FIG. 15 is a side elevation showing an exemplary COC-type semiconductor device having six chips stacked therein according to the second embodiment of the present invention.
Figure 16:
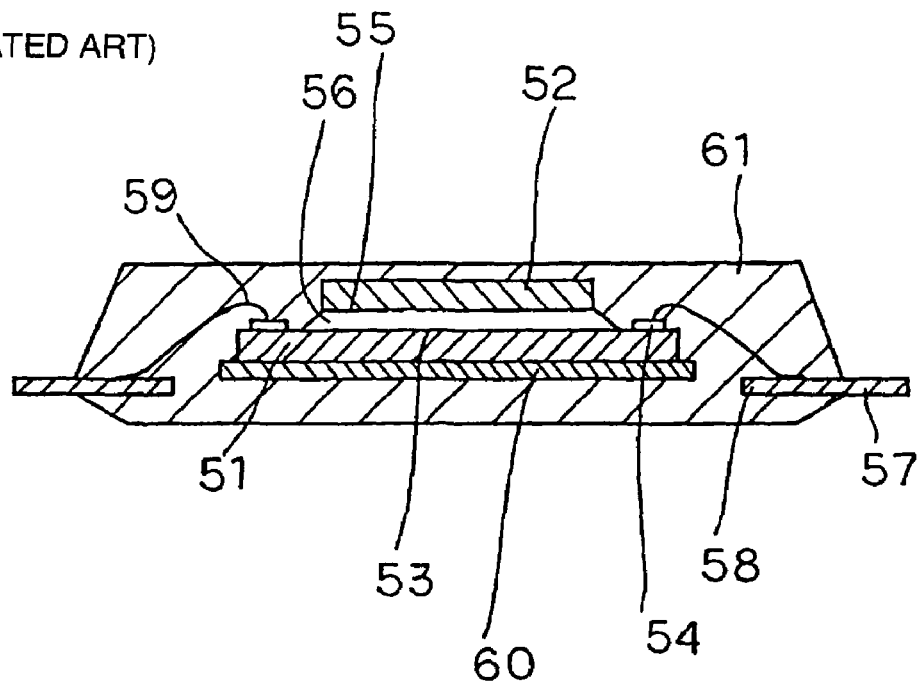
FIG. 16 is a sectional view showing a configuration of a conventional COC-type semiconductor device.
Figure 17:
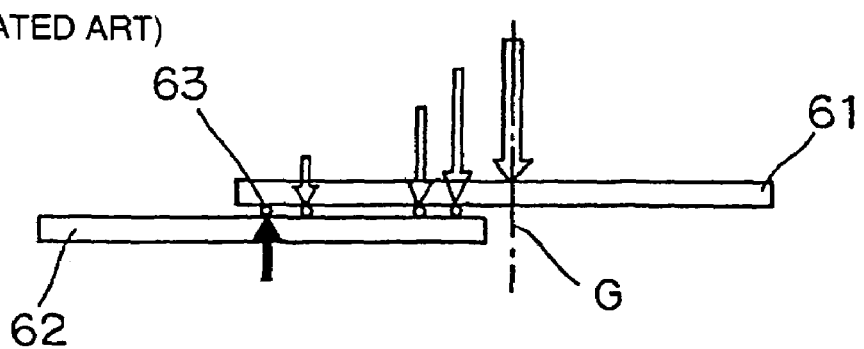
FIG. 17 is a drawing explaining problems to be solved by the present invention.

FIG. 14 and FIG. 15 are side elevations of semiconductor devices according to the second embodiment of the present invention, respectively having a plurality of chips stacked therein.

FIG. 14 shows an embodiment of a semiconductor device having three chips stacked on a substrate.

Similarly to the first embodiment, the first chip 3 is mounted on the substrate having electric wirings already formed thereon, and the second chip 4 is bonded on the first chip 3 based on the face-down bonding style. Parallel shifting of the second chip 4 with respect to the first chip 3 allows the surface of the first chip 3 to expose, and the exposed region serves as the external connection terminal region having a plurality of bonding pad arranged therein.

The individual bonding pads in the external connection terminal region and the surface electrodes of a third chip 16 are electrically connected to the surface electrodes on the circumferential portion of the substrate through the bonding wires.

In this embodiment, the third chip 16 is bonded on the second chip 4 so as to make coincidence of centers of gravity of the both.

FIG. 14 shows an exemplary semiconductor device using a logic chip for the first chip 3, and memory chips for the second chip 4 and third chip 16.

FIG. 15 shows an exemplary semiconductor device having a further larger number, six herein, of the chips stacked on the substrate. This embodiment shown in the drawing has, as being stacked on the first chip 3 mounted on the substrate 2, the second chip 4, the third chip 16, a fourth chip 17, a fifth chip 16 and a sixth chip 19 in this order, so as to make coincidence of the centers of gravity of the individual chips 4, 16, 17, 18 and 19 stacked on the first chip 3. FIG. 15 shows an exemplary semiconductor device using a logic chip for the first chip 3, and the same memory chips for the second chip 4, third chip 16, fourth chip 17, fifth chip 18 and sixth chip 19.

The individuals of the second to sixth chips 4, 16, 17, 18 and 19 have throughholes 20 through which the electrodes on the top surface and back surface are electrically connected, the electrodes on the top surfaces of the individual chips have bumps 21 formed thereon, and the electrodes on the back surfaces of the individual chips have bumps 22 formed thereon. The every adjacent chips are bonded through the individual bumps 21 on the electrodes on the top surface and the bumps 22 on the electrodes on the back surface, and are electrically connected through the throughholes 20.

The electrodes on the top surface of the first chip 3 have bumps 21 formed thereon, the electrodes on the back surface of the second chip 4 have bumps 22 formed thereon, and through these bumps 21, 22 the first chip 3 and second chip 4 are bonded.

According to the configurations shown in FIG. 14 and FIG. 15, only a pressing force is applied to the bumps between the every adjacent stacked chips, because the plurality of chips stacked on the first chip 3 are bonded while making coincidence of the centers of gravity with each other. That is, there is no fear of causing tensile stress on any of the bumps, and of degrading the bonding reliability. It is not always necessary for the chips placed on the second chip to have the center of gravity aligned with that of the second chip, and a stable bump bonding can be achieved if the center of gravity of the a whole stack, comprising the second chip and chips stacked thereon, falls inside bump area. More specifically, in an exemplary case where "n" chips are stacked while individually placing the bumps in between, a stable bump bonding of every adjacent chips can be achieved by allowing the center of gravity of a whole stack, comprising the (n+1)-th (n is an integer from 1 to (the number of stacked chips−1)) chip and all chips stacked thereon, to fall inside the bump region connecting the n-th (n is an integer from 1 to (the number of stacked chips−1)) chip and the (n+1)-th (n is an integer from 1 to (the number of stacked chips−1)) chip.

It is to be noted that the mode of stacking of the first chip 3 and second chip 4, and configuration of the bump area between the chips in the present embodiment may be such as those equivalent to as described in the first embodiment.

It is apparent that the present invention is not limited to the above embodiments, that may be modified and changed without departing from the scope and spirit of the invention.

What is claimed is:

1. A semiconductor device comprising:
a first semiconductor element and a second semiconductor element stacked thereon without aligning a center of the first semiconductor element with a center of the second semiconductor element; and
electrodes formed on said first semiconductor element being connected through bumps to electrodes formed on said second semiconductor element in the overlapped region,
wherein a center of gravity of said second semiconductor element falls inside a first bump area surrounded by the outermost bumps out of said bumps bonding said first semiconductor element and said second semiconductor element.

2. The semiconductor device according to claim 1, wherein the center of said first bump area and the center of gravity of said second semiconductor element coincide with each other.

3. The semiconductor device according to claim 1, wherein said first bump area comprises three bump groups comprising those for input/output, those for power supply and those for grounding.

4. The semiconductor device according to claim 1, wherein said second semiconductor element is a memory chip.

5. The semiconductor device according to claim 1, wherein said first bump area comprises bump groups formed symmetrically at least about a single axis on the basis of the center line of said second semiconductor element.

6. The semiconductor device according to claim 1, wherein said first semiconductor element has a plurality of external connection terminals arranged in a region thereof outside the overlapped region with said second semiconductor element, said plurality or external connection terminals being arranged in a staggered manner.

7. The semiconductor device according to claim 1, wherein a third semiconductor element is stacked on said second semiconductor element, so that the center of gravity of said third semiconductor element coincides with the center of gravity of said second semiconductor element.

8. The semiconductor device according to claim 1, wherein a plurality of semiconductor elements are stacked on said second semiconductor element, so that each of the centers of gravity of said plurality of semiconductor elements respectively coincides with the center of said second semiconductor element.

9. The semiconductor device according to claim 1, wherein said first semiconductor element and said second semiconductor element are bonded such that one end face of said second semiconductor element overlaps at least one end face of said first semiconductor element.

10. A semiconductor device comprising:
a first semiconductor element and a second semiconductor element stacked thereon without aligning a center of the first semiconductor element with a center of the second a semiconductor element such that one end face of said second semiconductor element overlaps at least one end face of said first semiconductor element;
electrodes formed on said first semiconductor element being connected through bumps to electrodes formed on said second semiconductor element in the overlapped region; and
a dummy chip being arranged under the run-over region of said second semiconductor element, and said electrodes formed on said second semiconductor element being bonded through bumps to electrodes formed on said dummy chip,
wherein a center of gravity of said second semiconductor element falls inside a region including a maximized area which is determined by connecting the outermost bumps in a first bump area and the outermost bumps in a second bump area so as to include the entire portions of the individual bump areas, said first bump area being surrounded by the outermost bumps bonding said first semiconductor element and said second semiconductor element, and said second bump area being surrounded by the outermost bumps bonding said second semiconductor element and said dummy chip.

11. The semiconductor device according to claim 10, wherein said first bump area comprises three bump groups comprising those for input/output, those for power supply and those for grounding.

12. The semiconductor device according to claim 10, wherein said second semiconductor element is a memory chip.

13. The semiconductor device according to claim 10, wherein said first bump area comprises bump groups formed symmetrically at least about a single axis on the basis of the center line of said second semiconductor element.

14. The semiconductor device according to claim 10, wherein said first semiconductor element has a plurality of external connection terminals arranged in a region thereof outside the overlapped region with said second semiconductor element, said plurality or external connection terminals being arranged in a staggered manner.

15. The semiconductor device according to claim 10, wherein a third semiconductor element is stacked on said second semiconductor element, so that the center of gravity of said third semiconductor element coincides with the center of gravity of said second semiconductor element.

16. The semiconductor device according to claim 10, wherein a plurality of semiconductor elements are stacked on said second semiconductor element, so that each of the centers of gravity of said plurality of semiconductor elements respectively coincides with the center of said second semiconductor element.

17. The semiconductor device according to claim 10, wherein said dummy chip is composed of a material having a thermal expansion coefficient close to that of the first semiconductor element.

18. The semiconductor device according to claim 17, wherein said dummy chip is composed of Si.

19. The semiconductor device according to claim 10, wherein thickness of said dummy chip falls between a maximum value and a minimum value, said maximum value being defined by a sum of thickness of said first semiconductor element and height-before-bonding of said bumps formed on said first semiconductor element, and said minimum value being defined by a balance obtained by subtracting the height-before-bonding of said bumps from distance-after-bonding between the back surface of said first semiconductor element and the top surface of said first semiconductor element.

20. The semiconductor device according to claim 10, wherein said dummy chip has a metal film formed on the surface thereof.

21. The semiconductor device according to claim 20, wherein said metal film comprises a Cr film and an Au film formed thereon.

22. The semiconductor device according to claim 10, wherein the thickness of said dummy chip is equivalent to the thickness of said first semiconductor element.

23. The semiconductor device according to claim 8, wherein a plurality of semiconductor elements are provided with through-holes through which the electrodes on a top surface and a back surface of the semiconductor elements are connected, and a plurality of the semiconductor elements are connected through the bumps.

24. The semiconductor device according to claim 16, wherein a plurality of semiconductor elements are provided with through-holes through which the electrodes on a top surface and a back surface of the semiconductor elements are connected, and a plurality of the semiconductor elements are connected through the bumps.

* * * * *